United States Patent
Park et al.

(10) Patent No.: US 11,235,554 B2
(45) Date of Patent: Feb. 1, 2022

(54) WINDOW MEMBER AND DISPLAY DEVICE INCLUDING THE SAME

(71) Applicant: Samsung Display Co., Ltd., Yongin-Si (KR)

(72) Inventors: Youngsang Park, Seoul (KR); Ahyoung Kim, Hwaseong-si (KR); Sungguk An, Suwon-si (KR); Chulho Jeong, Seoul (KR)

(73) Assignee: Samsung Display Co., Ltd.

( * ) Notice: Subject to any disclaimer, the term of this patent is extended or adjusted under 35 U.S.C. 154(b) by 131 days.

(21) Appl. No.: 16/183,664

(22) Filed: Nov. 7, 2018

(65) Prior Publication Data

US 2019/0143638 A1 May 16, 2019

(30) Foreign Application Priority Data

Nov. 16, 2017 (KR) .................. 10-2017-0153371

(51) Int. Cl.
*B32B 7/02* (2019.01)
*H05K 5/03* (2006.01)
(Continued)

(52) U.S. Cl.
CPC ................. *B32B 7/02* (2013.01); *B32B 7/12* (2013.01); *B32B 25/08* (2013.01); *B32B 27/08* (2013.01);
(Continued)

(58) Field of Classification Search
CPC ........... B32B 7/02; B32B 7/12; B32B 27/281; B32B 27/08; B32B 27/40; H05K 5/0017; H05K 5/03; Y10T 428/10; Y10T 428/1036; Y10T 428/1059; Y10T 428/1086; H01L 27/3244; H01L 2251/5338;
(Continued)

(56) References Cited

U.S. PATENT DOCUMENTS

| | | |
|---|---|---|
| 7,944,521 B2 | 5/2011 | Ichioka et al. |
| 8,929,085 B2 | 1/2015 | Franklin et al. |

(Continued)

FOREIGN PATENT DOCUMENTS

| | | |
|---|---|---|
| CN | 101501743 A | 8/2009 |
| CN | 103192558 A | 7/2013 |

(Continued)

OTHER PUBLICATIONS

Chinese Office Action Report, Application No. 201811358676.2 dated Sep. 28, 2021, 10 pages.

*Primary Examiner* — Ruiyun Zhang
(74) *Attorney, Agent, or Firm* — Innovation Counsel LLP

(57) ABSTRACT

A window member according to an embodiment of the inventive concept includes a first base member having a first thickness, a first impact absorbing layer disposed on one surface of the first base member and having a storage modulus less than that of the first base member and a second thickness, a first hard coating layer disposed on the first impact absorbing layer, and a second hard coating layer disposed on the other surface that is opposite to the one surface of the first base member. Here, a ratio of the second thickness to the first thickness is equal to or greater than about 1.0 and equal to or less than about 1.67. The first base member is bent with respect to a bending axis extending in one direction.

21 Claims, 14 Drawing Sheets

(51) Int. Cl.
*H01L 51/52* (2006.01)
*B32B 7/12* (2006.01)
*B32B 27/08* (2006.01)
*B32B 27/28* (2006.01)
*B32B 27/40* (2006.01)
*B32B 25/08* (2006.01)
*H05K 5/00* (2006.01)
*H01L 51/00* (2006.01)
*H01L 27/32* (2006.01)

(52) U.S. Cl.
CPC ............ *B32B 27/281* (2013.01); *B32B 27/40* (2013.01); *H01L 51/0097* (2013.01); *H01L 51/524* (2013.01); *H01L 51/5253* (2013.01); *H05K 5/0017* (2013.01); *H05K 5/03* (2013.01); *B32B 2255/10* (2013.01); *B32B 2307/54* (2013.01); *B32B 2307/56* (2013.01); *B32B 2457/20* (2013.01); *C09K 2323/05* (2020.08); *C09K 2323/06* (2020.08); *H01L 27/3244* (2013.01); *H01L 2251/5338* (2013.01); *H01L 2251/558* (2013.01)

(58) Field of Classification Search
CPC ......... H01L 2251/4558; H01L 51/5253; H01L 51/524; H01L 51/0097; C09K 2323/00; C09K 2323/03; C09K 2323/05; C09K 2323/06

USPC ....... 428/1.1, 1.3, 1.5, 1.54, 1.6, 195.1, 215, 428/217

See application file for complete search history.

(56) References Cited

U.S. PATENT DOCUMENTS

| | | |
|---|---|---|
| 9,069,521 B2 | 6/2015 | Lee et al. |
| 9,259,898 B2 | 2/2016 | Hirai et al. |
| 9,429,999 B2 | 8/2016 | Lee et al. |
| 9,661,114 B2 | 5/2017 | Jeong et al. |
| 2003/0211333 A1 | 11/2003 | Watanabe et al. |
| 2013/0177748 A1* | 7/2013 | Hirai ................ B32B 27/283 |
| | | 428/203 |
| 2015/0010742 A1 | 1/2015 | Han et al. |
| 2016/0048169 A1 | 2/2016 | Yang et al. |
| 2017/0156227 A1 | 6/2017 | Heo et al. |
| 2017/0170417 A1 | 6/2017 | Myung et al. |

FOREIGN PATENT DOCUMENTS

| | | |
|---|---|---|
| CN | 105862002 A | 8/2016 |
| KR | 10-2013-0081576 A | 7/2013 |
| KR | 10-2015-0004496 A | 1/2015 |
| KR | 10-2017-0064103 A | 6/2017 |

* cited by examiner

WINDOW MEMBER AND DISPLAY DEVICE INCLUDING THE SAME

CROSS-REFERENCE TO RELATED APPLICATIONS

This U.S. non-provisional patent application claims priority under 35 U.S.C. § 119 of Korean Patent Application No. 10-2017-0153371, filed on Nov. 16, 2017, the entire contents of which are hereby incorporated by reference.

BACKGROUND

The present disclosure herein relates to a window member and a display device including the same, and more particularly, to a window member having a flexible characteristic and an improved impact resistance with respect to an external impact and a display device including the same.

In recent years, a bendable or foldable electronic device has been actively developed. Such a flexible electronic device includes an electronic panel such as a flexible display panel or a flexible touch panel and various external members. The external members have different functions, respectively. Each of the external members is disposed on at least one of one surface and the other surface of the electronic device. The external members are warped, bent or folded together with the electronic device.

The external members are required to have a relatively flexible characteristic in order to be warped, bent, or folded. Although reliability with respect to a stress caused by bending may be improved when the external members have the flexible characteristic, reliability with respect to an external impact may be reduced.

SUMMARY

The present disclosure provides a window member having an improved flexibility and an improved impact resistance with respect to an external impact.

The present disclosure also provides a flexible display device preventing a display module from being damaged by an external impact while maintaining flexibility.

An embodiment of the inventive concept provides a window member including: a first base member having a first thickness; a first impact absorbing layer disposed on one surface of the first base member and having a storage modulus less than a storage modulus of the first base member and having a second thickness; a first hard coating layer disposed on the first impact absorbing layer; and a second hard coating layer disposed on an other surface that is opposite to the one surface of the first base member. Here, a ratio of the second thickness to the first thickness is equal to or greater than about 1.0 and equal to or less than about 1.67.

In an embodiment, the first thickness may be equal to or greater than about 30 µm and equal to or less than about 55 µm, and the second thickness may be equal to or greater than about 45 µm and equal to or less than about 55 µm.

In an embodiment, the window member may further include: a second impact absorbing layer disposed on the first hard coating layer and having a substantially same thickness as the second thickness; and a third hard coating layer disposed on the second impact absorbing layer.

In an embodiment, the window member may further include: a second base member disposed between the first base member and the second hard coating layer and having a third thickness; and an adhesive member disposed between the first base member and the second base member to couple the first base member to the second base member.

In an embodiment, a ratio of the third thickness to the first thickness may be equal to or greater than about 1.0 and equal to or less than about 1.67

In an embodiment, the third thickness may be equal to or greater than about 45 µm and equal to or less than about 55 µm.

In an embodiment, the second base member may have one surface facing the first base member and an other surface opposite to the one surface, and the second hard coating layer may contact the other surface of the second base member.

In an embodiment, the window member may further include a third impact absorbing layer disposed between the first base member and the second hard coating layer and having a storage modulus less than that of the first base member and a substantially same thickness as the second thickness.

In an embodiment, the window member may further include a functional layer disposed on the second hard coating layer; and a primer layer disposed between the functional layer and the second hard coating layer to increase an adhesion force between the functional layer and the second hard coating layer.

In an embodiment, the first base member may include: a bending area that is bendable along a bending axis extending in a first direction; and a flat area defined as an area adjacent to the bending area.

In an embodiment, the first base member may include polyimide.

In an embodiment, the first impact absorbing layer may include polyurethane, silicon-based polymer, or rubber.

In an embodiment, the first base member may have a storage modulus equal to or greater than about 3.5 GPa and equal to or less than about 7.0 GPa, and the first impact absorbing layer may have a storage modulus equal to or greater than about 45 MPa and equal to or less than about 50 MPa.

In an embodiment, the first impact absorbing layer may contact the one surface of the first base member, and the first hard coating layer may contact one surface of the first impact absorbing layer.

In an embodiment, the first hard coating layer may have a thickness equal to or greater than about 5 µm and equal to or less than about 10 µm.

In an embodiment of the inventive concept, a window member includes: a first base member that is bendable with respect to a bending axis extending along one direction; a first impact absorbing layer disposed on one surface of the first base member and having a storage modulus less than a storage modulus of the first base member; a first hard coating layer disposed on the first impact absorbing layer; a second hard coating layer disposed on the other surface that is opposite to an one surface of the first base member; and a second base member disposed between the first base member and the second hard coating layer.

In an embodiment of the inventive concept, a display device includes: a display module having a top surface configured to display an image and a rear surface that is opposite to the top surface; and a window member disposed on the top surface of the display module. The window member includes: a first hard coating layer disposed on the top surface; a first impact absorbing layer disposed on the first hard coating layer; a first base member disposed on the first impact absorbing layer; and a second hard coating layer disposed on the first base member. Here, a ratio of a thickness of the first impact absorbing layer to a thickness of the first base member is equal to or greater than about 1.0 and equal to or less than about 1.67.

In an embodiment, the first hard coating layer may contact one surface of the display module, the first impact absorbing layer may contact one surface of the hard coating layer, and the first base member may contact one surface of the first impact absorbing layer.

In an embodiment, the window member may include: a bending area that is bendable along a bending axis extending in a first direction; and a flat area defined as an area adjacent to the bending area.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
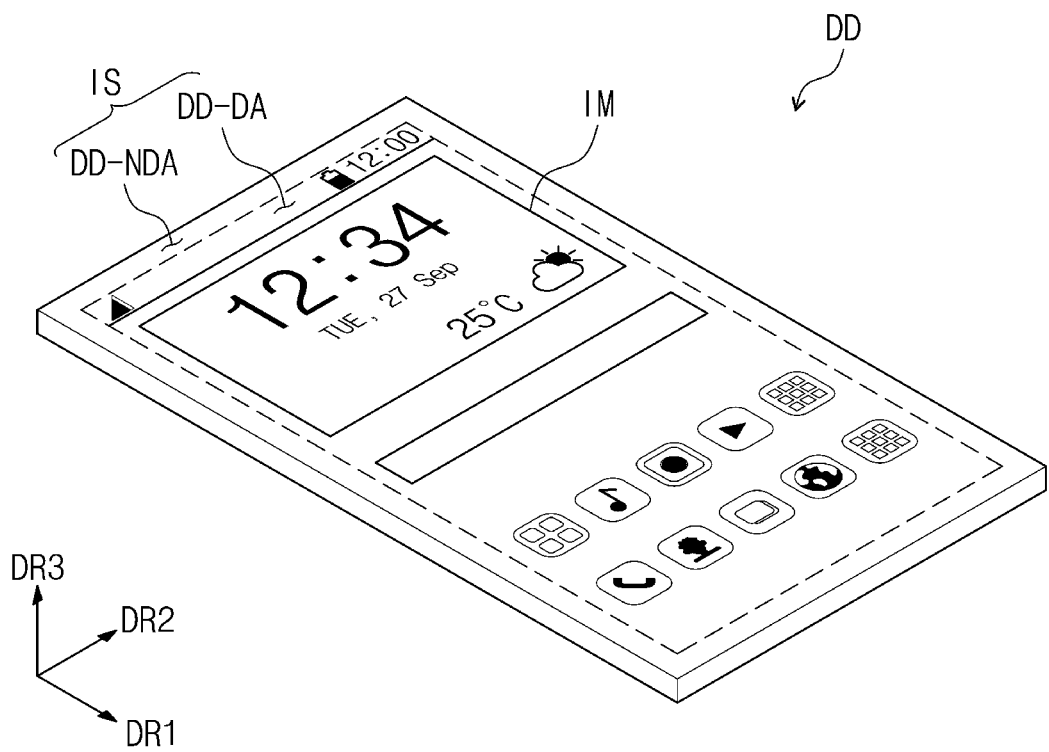
FIG. 1 is a perspective view of a display device according to an embodiment of the inventive concept.

Hereinafter, embodiments of the present inventive concept will be described with reference to the accompanying drawings. In this specification, it will also be understood that when one component (or region, layer, portion) is referred to as being 'on', 'connected to', or 'coupled to' another component, it can be directly connected/coupled on/to the one component, or an intervening third component may also be present.

Like reference numerals refer to like elements throughout. Also, in the figures, the thickness, ratio, and dimensions of components are exaggerated for clarity of illustration. The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, ""under", "below", "above", "upper", and the like are used for explaining relation association of components illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, exemplary embodiments of the inventive concept will be described below in more detail with reference to the accompanying drawings. Hereinafter, a display device according to an embodiment of the inventive concept will be described.

FIG. 1 is a perspective view of a display device according to an embodiment of the inventive concept; FIGS. 2A to 2E are perspective views illustrating a state in which the display device in FIG. 1 is folded or rolled. Hereinafter, a display device DD according to an embodiment of the inventive concept will be described with reference to FIGS. 1 and 2A to 2E.

Referring to FIG. 1, the display device DD according to an embodiment of the inventive concept includes a display surface IS for displaying an image. The display surface IS on which an image IM is displayed is parallel to a surface defined by a first direction DR1 and a second direction DR2. A normal direction of the display surface IS, i.e., a thickness direction of the display device DD indicates a third direction DR3. A front surface (or top surface) and a rear surface (or bottom surface) of each of members are divided by the third direction DR3. However, directions indicated by the first to third directions DR1, DR2, and DR3 may be a relative concept and thus converted into different directions. Although a flexible display device is illustrated in the embodiment, an embodiment of the inventive concept is not limited thereto. The display device DD according to an embodiment of the inventive concept may be a rigid display device.

The display device DD according to an embodiment of the inventive concept may be a foldable display device or a rollable display device. The display device DD according to an embodiment of the inventive concept may be used for large-sized electronic equipment such as televisions and monitors and small and middle-sized electronic equipment such as mobile phones, tablet PC, navigation units for vehicles, game consoles, and smart watches.

The display surface IS of the display device DD according to an embodiment of the inventive may include a plurality of areas. The display device DD may include a display area DD-DA on which the image IM is displayed and a non-display area DD-NDA disposed adjacent to the display area DD-DA. The non-display area DD-NDA may be an area on which an image is not displayed. In FIG. 1, icons and a clock window are illustrated as an example of the image IM. The display area DD-DA may have a rectangular shape. The non-display area DD-NDA may surround the display area DD-DA. However, the embodiment of the inventive concept is not limited thereto. For example, the display area DA and the non-display area NDA may be relatively designed in other different and/or complementary shapes.

Although not shown, the display device DD may include a housing. The housing may be disposed outside the display device DD and accommodate components therein.

Figure 2A:
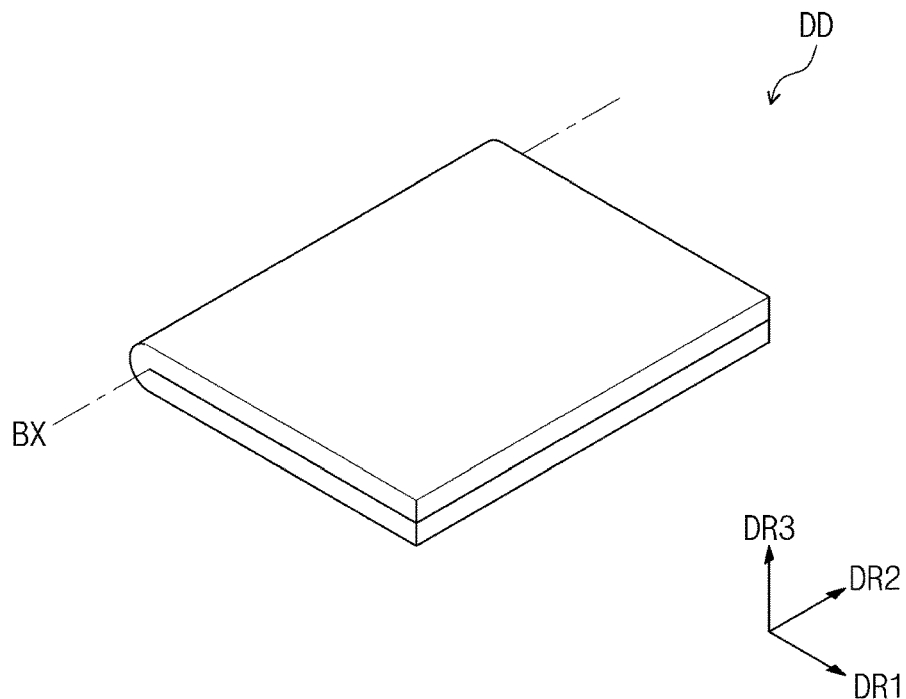
FIGS. 2A, 2B, 2C, 2D, and 2E are perspective views illustrating a state in which the display device in FIG. 1 is folded or rolled.

Referring to FIG. 2A, the display device DD according to an embodiment of the inventive concept may be in-folded with respect to a bending axis BX. As the display device DD according to an embodiment of the inventive concept is in-folded with respect to the bending axis BX, the display surface IS of the display device DD may be folded with respect to the bending axis BX, both sides of the display surface IS of the display device DD, which are divided with respect to the bending axis BX, may face and contact each other, and a rear surface, which is opposite to the display surface IS, may be exposed to the outside.

Figure 2B:
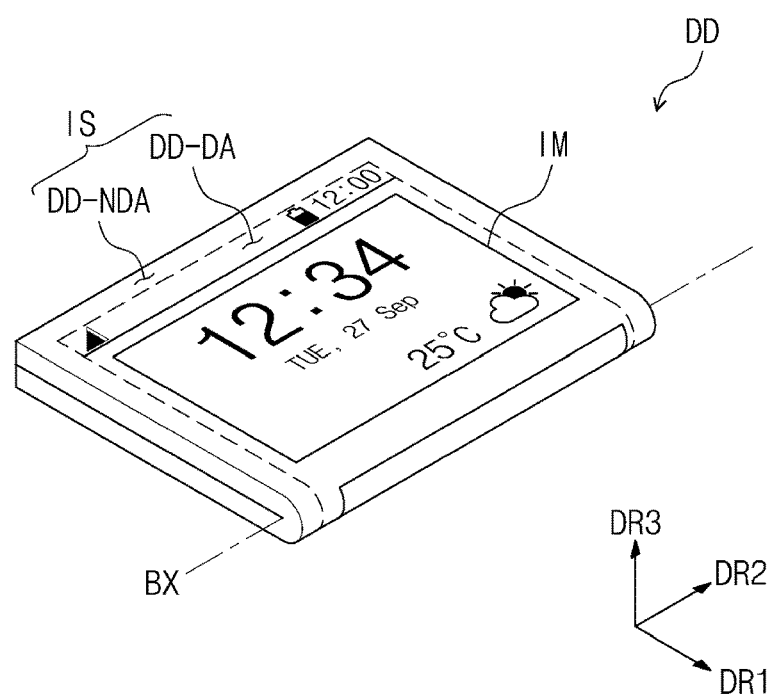

Referring to FIG. 2B, the display device DD according to an embodiment of the inventive concept may be out-folded with respect to the bending axis BX. As the display device DD according to an embodiment of the inventive concept is out-folded with respect to the bending axis BX, the display surface IS of the display device DD may be exposed to the outside, and the rear surface, which is opposite to the display surface IS, may be folded with respect to the bending axis BX, and both sides of the rear surface, which are divided with respect to the bending axis BX, may face and contact each other.

Figure 2C:
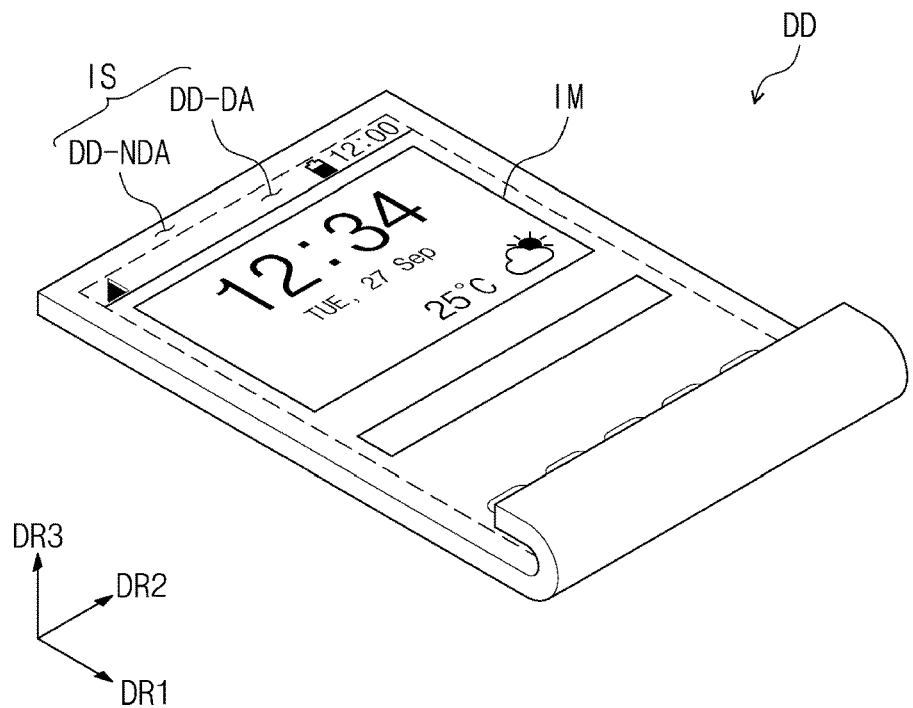
Figure 2D:
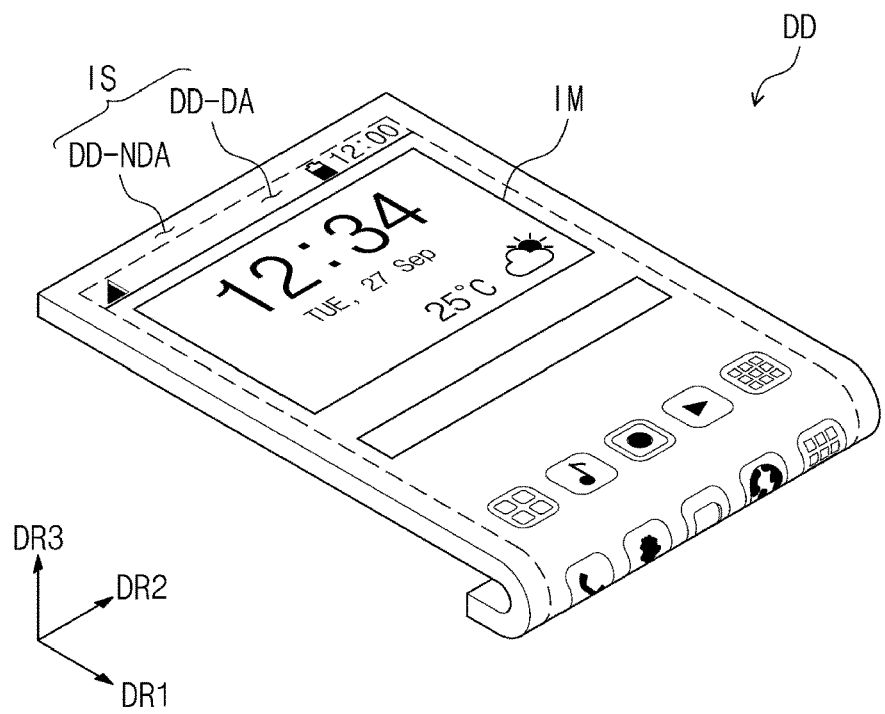
Figure 2E:
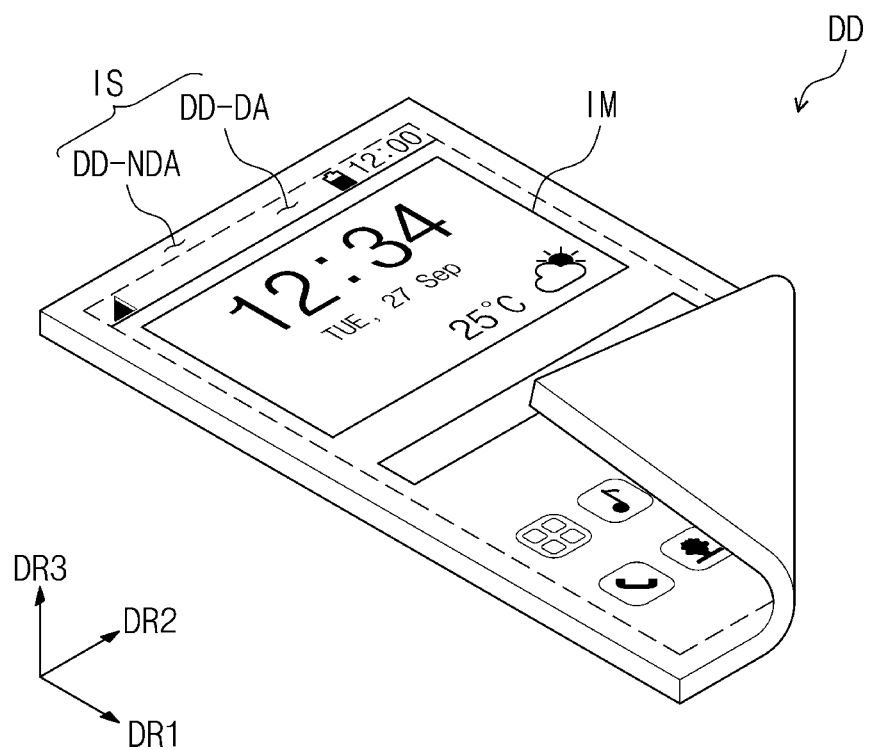

Referring to FIGS. 2C to 2E, the display device DD according to an embodiment of the inventive concept may be folded or rolled through various manners. As illustrated in FIG. 2C, the display device DD according to an embodiment of the inventive concept may be rolled or folded inwards from an end portion. As illustrated in FIG. 2D, the display device DD according to an embodiment of the inventive concept may be rolled or folded outwards from the end portion. As illustrated in FIG. 2E, the display device DD according to an embodiment of the inventive concept may be rolled or folded in a diagonal direction. However, although the methods of rolling or folding the display device DD are exemplarily illustrated in FIGS. 2A to 2E, an embodiment of the inventive concept is not limited thereto. For example, the display device DD may be folded or rolled through various other manners.

Figure 3A:
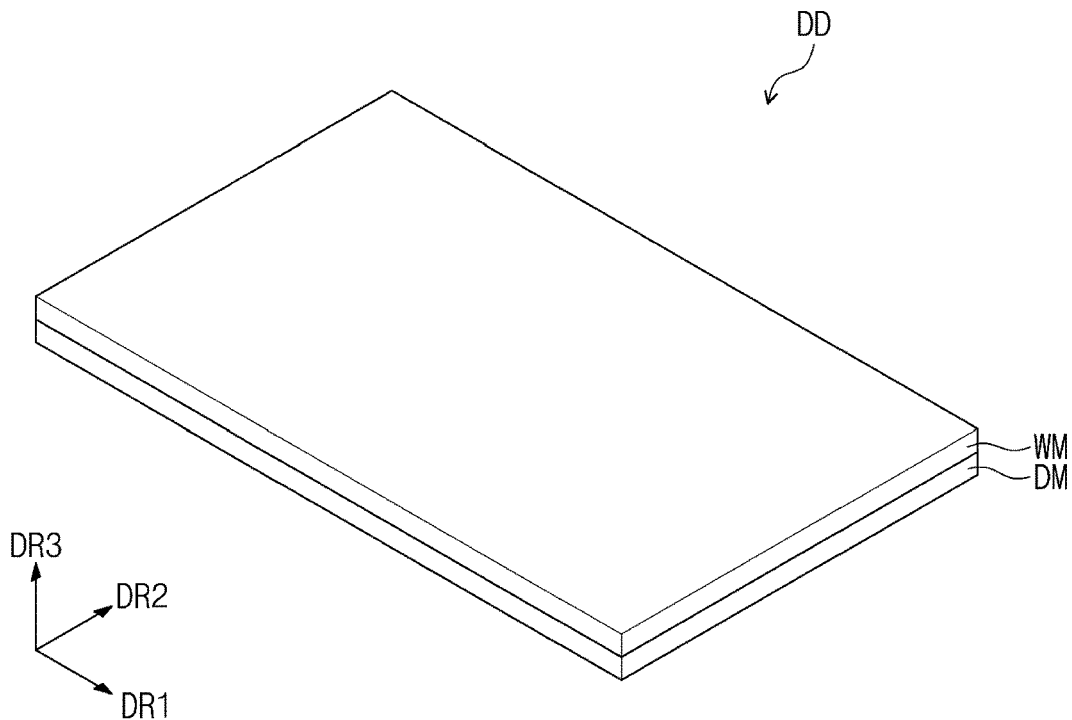
FIG. 3A is a perspective view of a display apparatus according to an embodiment of the inventive concept.
Figure 3B:
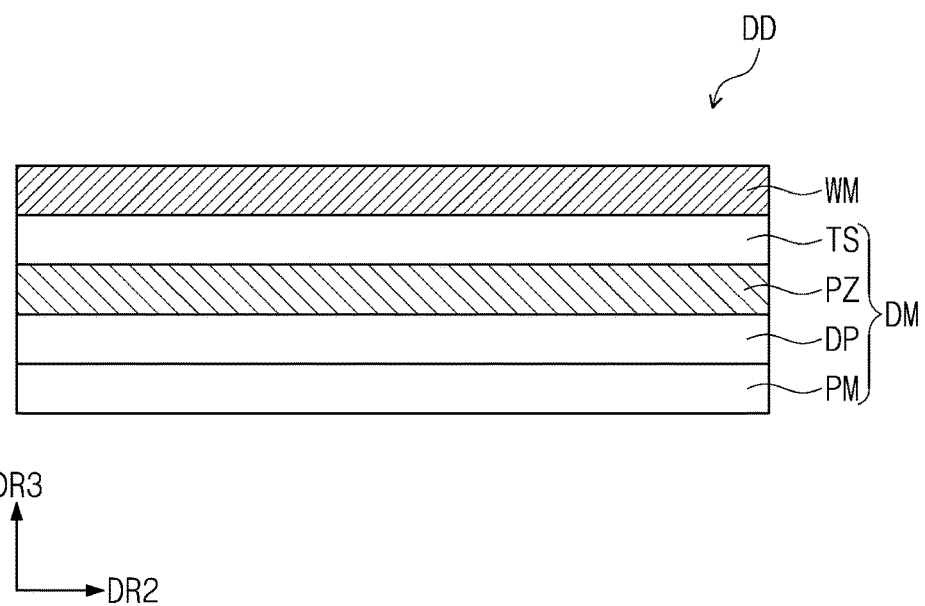
FIG. 3B is a cross-sectional view of a display device according to an embodiment of the inventive concept.

FIG. 3A is a perspective view of a display device according to an embodiment of the inventive concept. FIG. 3B is a cross-sectional view of a display device according to an embodiment of the inventive concept. FIG. 3B illustrates a cross-section defined by the second direction DR2 and the third direction DR3. Hereinafter, the display device DD according an embodiment of the inventive concept will be described with reference to FIGS. 3A and 3B.

Referring to FIGS. 3A and 3B, the display device DD according an embodiment of the inventive concept includes a display module DM and a window member WM.

The display module DM may include a protective film PM, a display panel DP, an optical member PZ, and a pressure sensing member TS. The display panel DP, the optical member PZ, and the pressure sensing member TS may be sequentially laminated on the protective film PM.

The display module DM may include a top surface and a rear surface opposite to the top surface. The top surface of the display module DM may be a display surface for displaying an image. The display module DM may generate an image and display the image in a direction toward the window member WM that contacts the top surface of the display module DM.

The window member WM may protect the display module DM against an external impact and provide an input surface to a user. The window member WM may include an outer surface that is exposed to the outside. The display surface IS (refer to FIG. 1) of the display device DD may correspond to the outer surface of the window member WM. The window member WM will be described in detail later with reference to FIGS. 8A to 9B.

The pressure sensing member TS may detect a touch applied from the outside to generate an electric signal. The touch includes contact/adjacency of a human body, contact/adjacency of a conductive object, and various types of external inputs such as light, heat, and pressure. The input sensing member TS may include sensors capable of detecting various inputs, e.g., a conductive sensor, an optical sensor, and a thermal sensor. The input sensing member TS may detect a touch applied in a capacitive method or a pressure sensing method.

The optical member PZ converts incident light in an optical manner. The optical member PZ may decrease reflectance of light incident into a front surface thereof, induce re-reflection of light incident into a rear surface thereof, and increase transmittance of light incident into the rear surface thereof. The optical member PZ may include at least one of a polarizing film, a reflection preventing film, a phase difference film, and a scattering preventing film.

Although it is exemplarily illustrated in FIG. 3B that the input sensing member TS is disposed on the optical member PZ, and the optical member PZ is adjacent to the display panel DP, an embodiment of the inventive concept is not limited thereto. For example, an arrangement relationship between components may be varied. For example, the input sensing member TS may be disposed on the display panel DP, and the optical member PZ may be disposed on the input sensing member TS. The input sensing member TS may be integrated with the display panel DP through a continuous process. In this case, the input sensing member TS may be referred to as an input sensing unit or an input sensing circuit.

The display panel DP may include a plurality of pixels and generate the image IM (refer to FIG. 1) corresponding to inputted image data. The display panel DP may generate an image and display the image in a thickness direction DR3 of the display device DD. The display panel DP may display the generated image in an upward direction toward the window member WM.

The protective film PM may be disposed below the display panel DP to protect the display panel DP. In more detail, the protective film PM may prevent external moisture from being introduced into the display panel DP and absorb an external impact. The protective film PM may include a plastic film as a base layer. The protective film PM may include the plastic film containing one selected from the group of polyethersulphone (PES), polyacrylate (PAR), polyetherimide (PEI), polyethyelenennapthalate (PEN), polyethyeleneterepthalate (PET), polyphenylene sulfide (PPS), polyallylate, polyimide (PI), polycarbonate (PC), and poly(arylene ethersulfone) and a combination thereof.

The material constituting the protective film PM is not limited to the plastic resins. For example, the protective film PM may include an organic/inorganic composite material. The protective film PM may include a porous organic layer and inorganic materials filled in pores of the organic layer. The protective film PM may further include a film-functional layer provided on a plastic film. The film-functional layer may include a resin layer. The film-functional layer may be formed in a coating method.

Although not shown, the display device DD may further include a first adhesive member, a second adhesive member, a third adhesive member, and a fourth adhesive member. The first adhesive member couples the display panel DP to the protective film PM, the second adhesive member couples the display panel DP to the optical member PZ, the third adhesive member couples the optical member PZ to the input sensing member TS, and the fourth adhesive member couples the input sensing member TS to the window member WM.

Although not shown, the display device DD may further include a frame structure to maintain a state illustrated in FIGS. 2A to 2E. The frame structure may include a joint structure or a hinge structure.

Figure 4:
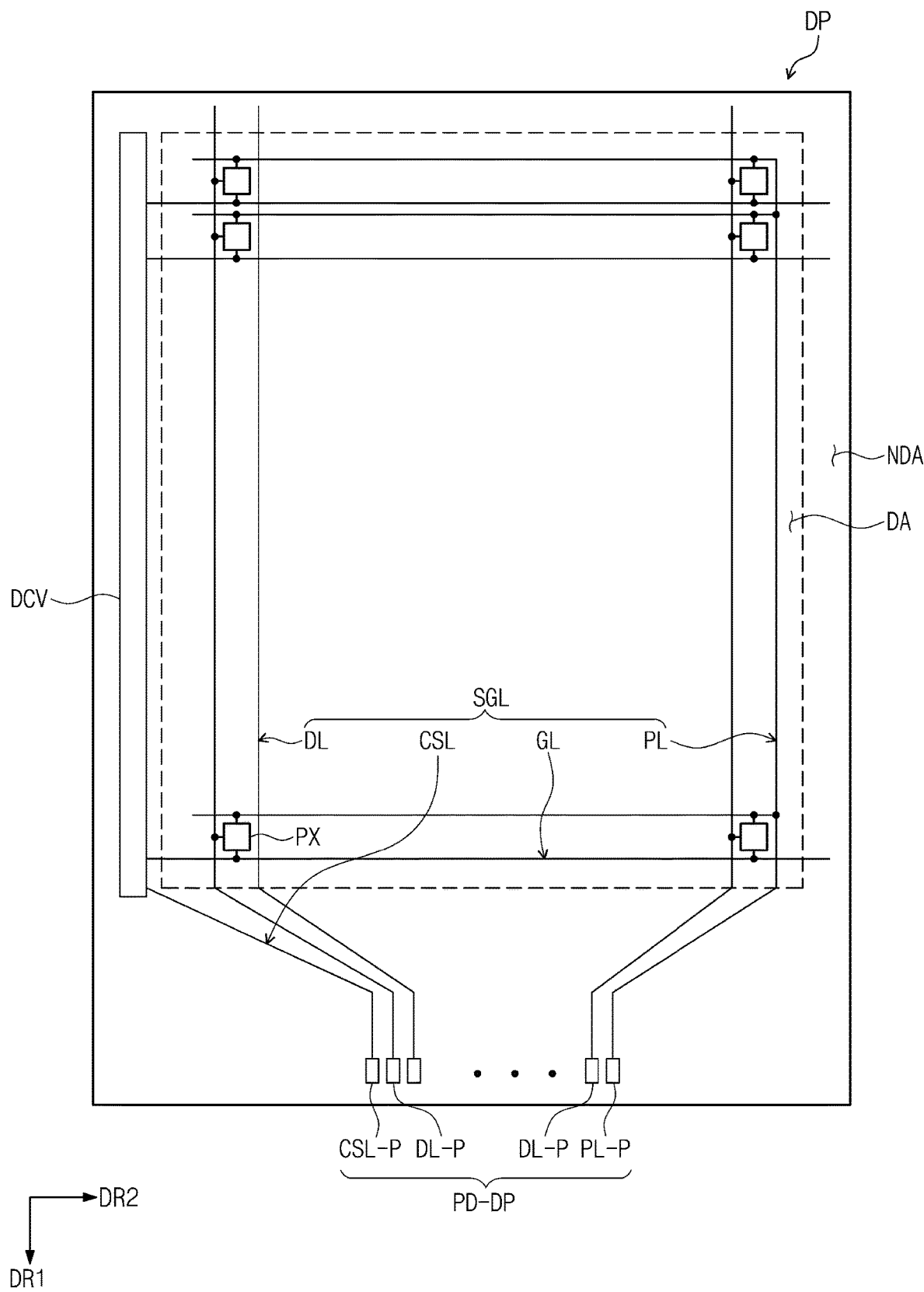
FIG. 4 is a plan view of a display panel included in a display device according to an embodiment of the inventive concept.
Figure 5:
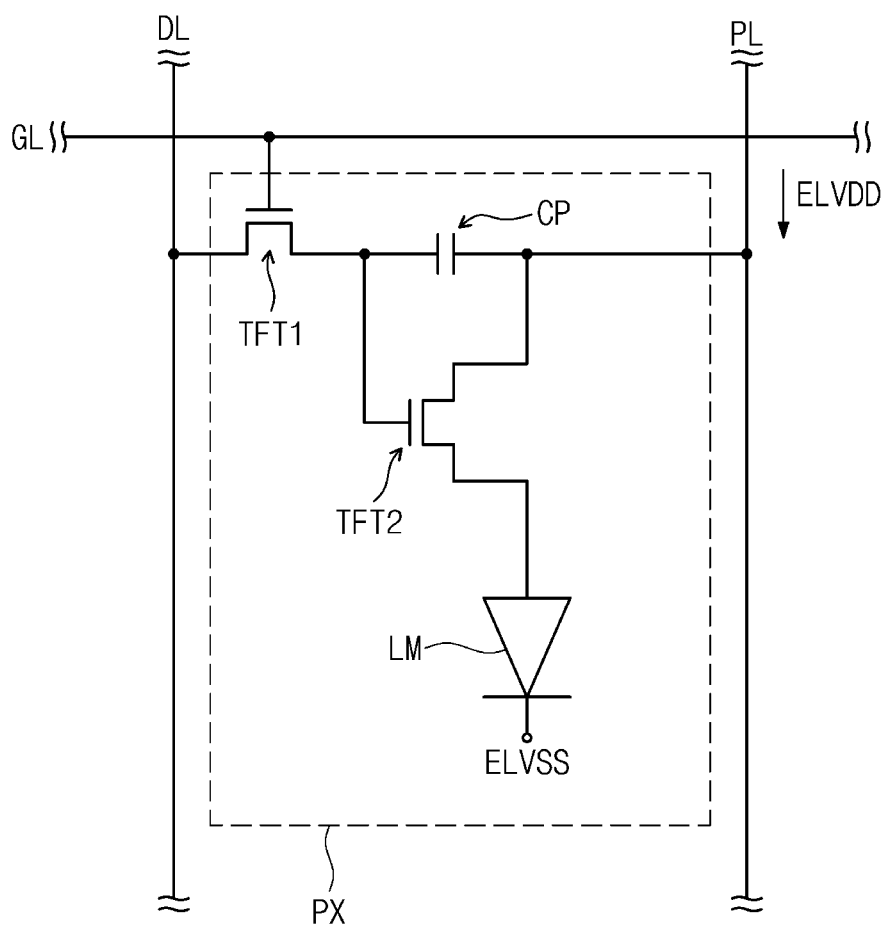
FIG. 5 is an equivalent circuit diagram of a display device according to an embodiment of the inventive concept.
Figure 6:
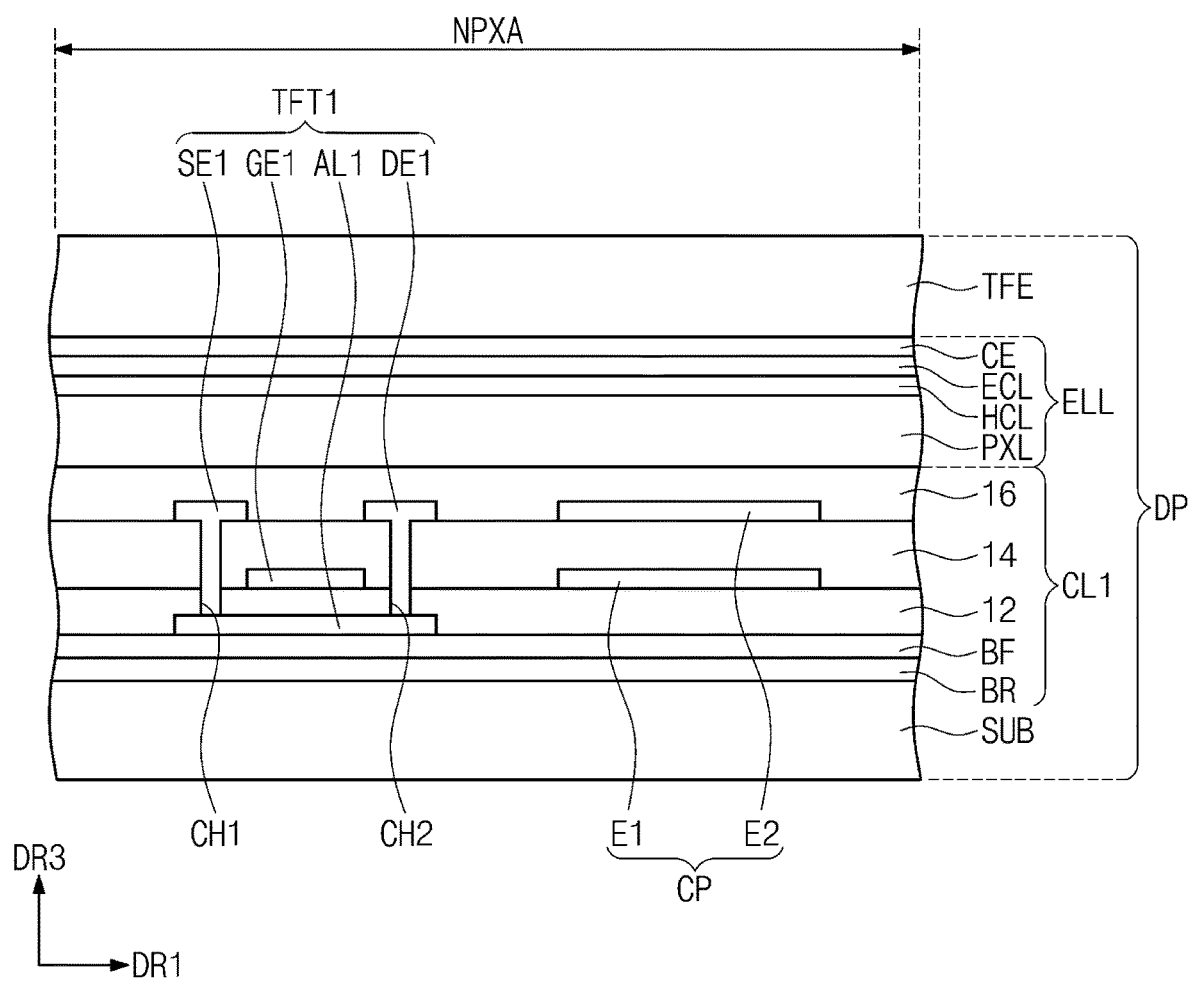
FIGS. 6 and 7 are partial cross-sectional views of a display device according to an embodiment of the inventive concept.
Figure 7:
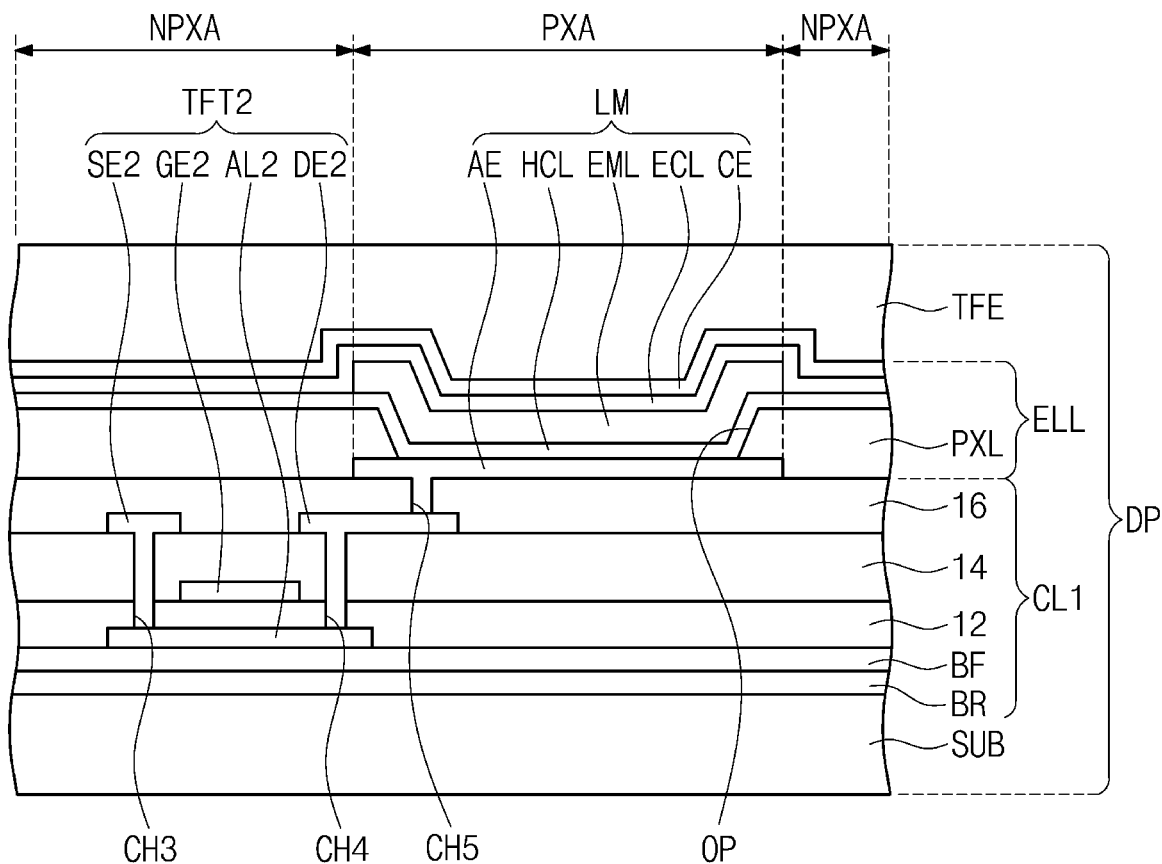

FIG. 4 is a plan view illustrating a display panel included in the display device according to an embodiment of the inventive concept. FIG. 5 is an equivalent circuit diagram of the display device according to an embodiment of the inventive concept; FIGS. 6 and 7 are partial cross-sectional view of the display device according to an embodiment of the inventive concept. Hereinafter, the display panel according to an embodiment of the inventive concept will be described with reference to FIGS. 4 to 7.

As illustrated in FIG. 4, the display panel DP includes the display area DA and the non-display area NDA on a plane. The display area DA and the non-display area NDA of the display panel DP correspond to the display area DD-DA (refer to FIG. 1) and the non-display area DD-NDA (refer to FIG. 1) of the display device DD (refer to FIG. 1), respectively. However, the display area DA and the non-display area NDA of the display panel DP may not be the same as the display area DD-DA (refer to FIG. 1) and the non-display area DD-NDA (refer to FIG. 1) of the display device DD (refer to FIG. 1), and may be varied according to the structure/design of the display panel DP.

The display panel DP includes a plurality of signal lines SGL and a plurality of pixels PX. The display area DA is defined by an area on which the plurality of pixels PX are disposed. In this embodiment, the non-display area NDA may be defined along an edge of the display area DA.

The plurality of signal lines SGL includes gate lines GL, data lines DL, a power line PL, and a control signal line CSL. Each of the gate lines GL are connected to a corresponding pixel among the plurality of pixels PX, and each of the data lines DL is connected to a corresponding pixel PX among the plurality of pixels PX. The power line PL is connected to the plurality of pixels PX. A gate driving circuit DCV connected to the gate lines GL may be disposed at one side of the non-display area NDA. The control signal line CSL may provide control signals to the gate driving circuit DCV.

A portion of the gate lines GL, the data lines DL, the power line PL, and the control line CSL is disposed on the same layer, and another portion thereof is disposed on a different layer. When signal lines, which are disposed on one layer, among the gate lines GL, the data lines DL, the power line PL, and the control line CSL are defined as a first signal line, signal lines disposed on another layer may be defined as a second signal line. Signal lines disposed on still another layer may be defined as a third signal line.

Each of the gate lines GL, the data lines DL, the power line PL, and the control line CSL may include a signal wire part and display panel pads PD-DP connected to an end of the signal wire part. The signal wire part may be defined as a portion, except for the display panel pads PD-DP, of each of the gate lines GL, the data lines DL, the power line PL, and the control line CSL.

The display panel pads PD-DP may be formed in the same process as that of transistors for driving the pixels PX. For example, the display panel pads PD-DP and the transistors for driving the pixels PX may be formed in the same process of a low temperature polycrystalline silicon (LTPS) process or a low temperature polycrystalline oxide (LTPO) process.

The display panel pads PD-DP according to an embodiment of the inventive concept may include a control pad CSL-P, a data pad DL-P, and a power pad PL-P. Although the gate pad is not shown, the gate pad may overlap the gate driving circuit DCV and be connected to the gate driving circuit DCV. Although not separately shown, a portion of the non-display area NDA on which the control pad CSL-P, the data pad DL-P, and the power pad PL-P are aligned is defined as a pad area.

FIG. 5 exemplarily illustrates the pixel PX connected to one of the gate lines GL, one of the data lines DL, and the power line PL. An embodiment of the inventive concept is not limited to the configuration of the pixel PX.

The pixel PX may include a light emitting element LM that is a display element. In an embodiment of the inventive concept, the light emitting element LM may be an organic light emitting diode.

The light emitting element LM may include a top emission type diode, a bottom emission type diode, and a both side emission type diode. The pixel PX that is a circuit for driving the light emitting element LM includes a first transistor TFT1 (or switching transistor), a second transistor TFT2 (or driving transistor), and a capacitor CP. The light emitting element LM generates light by an electric signal provided from the transistor TFT1 and TFT2.

The first transistor TFT1 outputs a data signal applied to the data line DL in response to a scan signal applied to the scan line GL. The capacitor CP charges a voltage corresponding to the data signal received from the first transistor TFT1.

The second transistor TFT2 is connected to the light emitting element LM. The second transistor TFT2 controls a driving current flowing in the light emitting element LM in correspondence to the quantity of electric charge stored in the capacitor CP.

FIG. 6 illustrates a cross-section corresponding to the first transistor TFT1 and the capacitor CP of the equivalent circuit in FIG. 5. FIG. 7 illustrates a cross-section corresponding to the second transistor TFT2 and the light emitting element LM of the equivalent circuit in FIG. 5.

As illustrated in FIGS. 6 and 7, a first circuit layer CL1 is disposed on a base layer SUB. The base layer SUB that is a flexible substrate may include a plastic substrate, a glass substrate, a metal substrate, or an organic/inorganic composite substrate.

A semiconductor pattern AL1 (hereinafter, referred to as a first semiconductor pattern) of the first transistor TFT1 and a semiconductor pattern AL2 (hereinafter, referred to as a second semiconductor pattern) of the second transistor TFT2 are disposed on the base layer SUB. The first semiconductor pattern AL1 and the second semiconductor pattern AL2 may be selected from an amorphous silicon, poly silicon, or metal oxide semiconductor in a same or different manner.

The first circuit layer CL1 includes organic/inorganic layers BR, BF, 12, 14, and 16. The first circuit layer CL1 may include a first transistor TFT1, a second transistor TFT2, and electrodes E1 and E2. The organic/inorganic layers BR, BF, 12, 14, and 16 may include functional layer BR and BF, a first insulation layer 12, a second insulation layer 14, and a third insulation layer 16.

The functional layer BR and BF may be disposed on one surface of the base layer SUB. The functional layer BR and BF includes at least one of a barrier layer BR and a buffer layer BF. The first and second semiconductor patterns AL1 and AL2 may be disposed on the barrier layer BR or the buffer layer BF.

The first insulation layer 12 covering the first and second semiconductor patterns AL1 and AL2 is disposed on the base layer SUB. The first insulation layer 12 includes an organic layer and/or an inorganic layer. In particular, the first insulation layer 12 may include a plurality of inorganic thin films. The plurality of inorganic thin films may include a silicon nitride layer, a silicon oxynitride layer, and a silicon oxide layer.

A control electrode GE1 (hereinafter, referred to as a first control electrode) of the first transistor TFT1 and a control electrode GE2 (hereinafter, referred to as a second control electrode) of the second transistor TFT2 are disposed on the first insulation layer 12. A first electrode E1 of the capacitor CP is disposed on the first insulation layer 12. The first control electrode GE1, the second control electrode GE2, and the first electrode E1 may be manufactured by the same photolithography process as that of the gate lines GL (refer to FIG. 4). In other words, the first electrode E1 may be made of the same material, have the same lamination structure, and be disposed on the same layer as those of the gate lines GL.

A second insulation layer 14 covering the first control electrode GE1, the second control electrode GE2, and the first electrode E1 is disposed on the first insulation layer 12. The second insulation layer 14 includes an organic layer and/or an inorganic layer. In particular, the second insulation layer 14 may include a plurality of inorganic thin films. The plurality of inorganic thin films may include a silicon nitride layer, a silicon oxynitride layer, and a silicon oxide layer.

The data lines DL (refer to FIG. 4) may be disposed on the second insulation layer 14. An input electrode SE1 (hereinafter, referred to as a first input electrode) and an output electrode DE1 (hereinafter, referred to as a first output electrode) of the first transistor TFT1 are disposed on the second insulation layer 14. An input electrode SE2 (hereinafter, referred to as a second input electrode) and an output electrode DE2 (hereinafter, referred to as a second output electrode) of the second transistor TFT2 are disposed on the second insulation layer 14. The first input electrode SE1 is branched from a corresponding data line of the data lines DL. The power line PL (refer to FIG. 4) may be disposed on the same layer as that of the data lines DL. The second input electrode SE2 is branched from the power line PL.

A second electrode E2 of the capacitor CP is disposed on the second insulation layer 14. The second electrode E2 may be manufactured by the same photolithography process, made of the same material, having the same lamination structure, and be disposed on the same layer as those of the data lines DL and the power line PL.

The first input electrode SE1 and the first output electrode DE1 are connected to the first semiconductor pattern AL1 respectively through a first through-hole CH1 and a second through-hole CH2, which pass through the first insulation layer 12 and the second insulation layer 14, respectively. The first output electrode DE1 may be electrically connected to the first electrode E1. For example, the first output electrode DE1 may be connected to the first electrode E1 through a through hole (not shown) passing through the second insulation layer 14. The second input electrode SE2 and the second output electrode DE2 are connected to the second semiconductor pattern AL2 respectively through a third through-hole CH3 and a fourth through-hole CH4, which pass through the first insulation layer 12 and the second insulation layer 14, respectively. Meanwhile, in another embodiment of the inventive concept, each of the first and second transistors TR1 and TR2 may be deformed into a bottom gate structure.

A third insulation layer 16 covering the first input electrode SE1, the first output electrode DE1, the second input electrode SE2, and the second output electrode DE2 is disposed on the second insulation layer 14. The third insulation layer 16 includes an organic layer and/or an inorganic layer. In particular, the third insulation layer 16 may include an organic material to provide a flat surface.

One of the first insulation layer 12, the second insulation layer 14, and the third insulation layer 16 may be omitted according to a circuit structure of a pixel. Each of the second insulation layer 14 and the third insulation layer 16 may be defined as an interlayer. The interlayer is disposed between a conductive pattern disposed below and a conductive pattern disposed above with respect to the interlayer to insulate the conductive patterns.

A light emitting element layer ELL is disposed on the third insulation layer 16. The light emitting element layer ELL includes light emitting elements LM.

A pixel defining layer PXL and the light emitting element LM are disposed on the third insulation layer 16. An anode AE is disposed on the third insulation layer 16. The anode AE is connected to the second output electrode DE2 through a fifth through-hole CH5 passing through the third insulation layer 16. An opening OP is defined in the pixel defining layer PXL. The opening OP of the pixel defining layer PXL exposes at least a portion of the anode AE.

The light emitting element layer ELL includes a light emitting area PXA and a non-light emitting area NPXA adjacent to the light emitting area PXA. The non-light emitting area NPXA may surround the light emitting area PXA. In this embodiment, the light emitting area PX is defined in correspondence to the anode AE. However, an embodiment of the inventive concept is not limited to the light emitting area PXA. For example, the light emitting area PXA may be defined as an area emitting light. The light emitting area PXA may be defined in correspondence to a partial area of the anode AE that is exposed by the opening OP.

A hole control layer HCL may be disposed in common on the light emitting area PXA and the non-light emitting area NPXA. Although not separately shown, a common layer such as the hole control layer HCL may be provided in common on the plurality of pixels PX (refer to FIG. 4).

An organic light emitting layer EML is disposed on the hole control layer HCL. The organic light emitting layer EML may be disposed on only an area corresponding to the opening OP. That is, the organic light emitting layer EML may be separately provided on each of the plurality of pixels PX.

An electron control layer ECL is disposed on the organic light emitting layer EML. A cathode CE is disposed on the electron control layer ECL. The cathode CE is disposed in common on the plurality of pixels PX.

Although the patterned organic light emitting layer EML is exemplarily illustrated in this embodiment, the organic light emitting layer EML may be disposed in common on the plurality of pixels PX. Here, the organic light emitting layer EML may generate white light. Also, the organic light emitting layer EML may have a multilayer structure. The organic light emitting layer EML may include an organic material or an inorganic material.

A thin film encapsulation layer TFE seals the light emitting element layer ELL. The thin film encapsulation layer TFE may include at least two inorganic thin films with an organic thin film disposed therebetween. The thin film encapsulation layer TFE may protect the light emitting element layer ELL from foreign substances such as moisture and dust particles.

In an embodiment of the inventive concept, the thin film encapsulation layer TFE may directly covers the cathode CE. The thin film encapsulation layer TFE may include an organic layer containing an organic material and an inorganic layer containing an inorganic material.

FIGS. 8A to 8F are cross-sectional views illustrating a window member according to an embodiment of the inventive concept. FIGS. 8A to 8F illustrate a cross-section defined by the second direction DR2 and the third direction DR3. Hereinafter, a window member according to an embodiment of the inventive concept will be described with reference to FIGS. 8A to 8F.

Figure 8A:
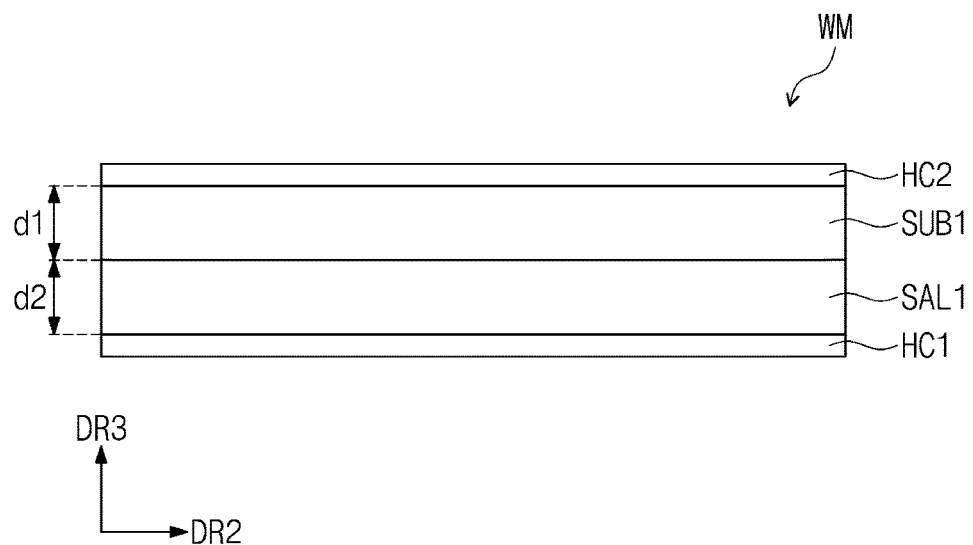
FIGS. 8A, 8B, 8C, 8D, 8E, and 8F are cross-sectional views of a window member according to an embodiment of the inventive concept.

Referring to FIG. 8A, a window member WM according to an embodiment of the inventive concept includes a first base member SUB1, a first impact absorbing layer SAL1, a first hard coating layer HC1, and a second hard coating layer HC2.

The first base member SUB1 may include a transparent polymer material. For example, the first base member SUB1 may include polyimide, polyacrylate, polymethylmethacrylate (PMMA), polycarbonate (PC), polyethylenenaphthalate (PEN), polyvinylidene chloride, polyvinylidene difluoride (PVDF), polystyrene, ethylene vinylalcohol copolymer, and a combination thereof. Desirably, the first base member SUB1 may include polyimide to increase a transparency, a strength, and a surface hardness.

The first impact absorbing layer SAL1 is disposed on one surface of the first base member SUB1. The first impact absorbing layer SAL1 may contact the first base member SUB1. The first impact absorbing layer SAL1 may include polyurethane, silicon-based polymer, or rubber. For example, the first impact absorbing layer SAL1 may include polyurethane. The first impact absorbing layer SAL1 may serve as a stress buffer for relieving an impact applied to the first base member SUB1.

The first impact absorbing layer SAL1 is a high elastic layer having a storage modulus less than that of the first base member SUB1. For example, the first base member SUB1 may have a high storage modulus equal to or greater than about 3.5 GPa and equal to or less than about 7.0 GPa, and the first impact absorbing layer SAL1 may have a low storage modulus equal to or greater than about 45 MPa and equal to or less than about 50 MPa.

The first impact absorbing layer SAL1 has a thickness equal to or greater than that of the first base member SUB1. The first base member SUB1 has a first thickness d1, and the first impact absorbing layer SAL1 has a second thickness d2. The second thickness d2 may be equal to or greater than about 1.0 and equal to or less than about 1.67 times the first thickness d1. For example, the first thickness d1 may be equal to or greater than about 30 µm and equal to or less than about 55 m, and the second thickness d2 may be equal to or greater than about 45 µm and equal to or less than about 55 µm. In the window member WM according to an embodiment of the inventive concept, the first thickness d1 may be about 50 m, and the second thickness d2 may be about 50 µm.

The first hard coating layer HC1 is disposed on the first impact absorbing layer SAL1. The second hard coating layer HC2 is disposed on the first base member SUB1. The second hard coating layer HC2 is disposed on the other surface of the first base member SUB1, which is opposite to the one surface on which the first impact absorbing layer SAL1 is disposed. The first hard coating layer HC1 may contact one surface of the first impact absorbing layer SAL1, and the second hard coating layer HC2 may contact the other surface of the first base member SUB1. Each of the first hard coating layer HC1 and the second hard coating layer HC2 may be disposed on an outermost portion of the window member WM. Each of the first hard coating layer HC1 and the second hard coating layer HC2 may have a thickness equal to or greater than about 5 µm and equal to or less than about 10 µm. Each of the first hard coating layer HC1 and the second hard coating layer HC2 may have a high hardness equal to or greater than about 6H in pencil hardness.

Each of the first hard coating layer HC1 and the second hard coating layer HC2 may include an organic compound or an organic/inorganic composite compound. For example, each of the first hard coating layer HC1 and the second hard coating layer HC2 may include an acryl-based compound, an epoxy-based compound, or a combination thereof. Also, each of the first hard coating layer HC1 and the second hard coating layer HC2 may include a compound in which inorganic particles such as silicon oxide ($SiO_2$), zirconium oxide ($ZrO_2$), aluminum oxide ($Al_2O_3$), tantalum oxide ($Ta_2O_5$), and niobium oxide ($Nb_2O_5$, $NbO_2$) are mixed in an organic compound.

The first hard coating layer HC1 may be a component most adjacent to the display module DM (refer to FIG. 3A) among components included in the window member WM. The hard coating layer HC1 may contact the display module DM. In the window member WM according to an embodiment of the inventive concept, with respect to the first base member SUB1, the first impact absorbing layer SAL1 may be disposed between the first hard coating layer HC1 and the first base member SUB1 in a direction adjacent to the display module, and an impact absorbing layer may not be disposed between the second hard coating layer HC2 and the first base member SUB1 in a direction away from the display module.

The window member WM according to an embodiment of the inventive concept includes the hard coating layer disposed on each of both surfaces of the base member, and the impact absorbing layer is disposed between the base member and the hard coating layer in the direction adjacent to the display module. According to an embodiment of the inventive concept, as the impact absorbing layer having a low storage modulus is disposed in the direction adjacent to the display module, the window member that is strong against an impact applied from the outside may be provided.

FIGS. 8B to 8F illustrate a cross-section of a window member according to another embodiment of the inventive concept. Hereinafter, the same components as those described in FIG. 8A will be designated by the same reference numerals, and overlapped description will be omitted.

Figure 8B:
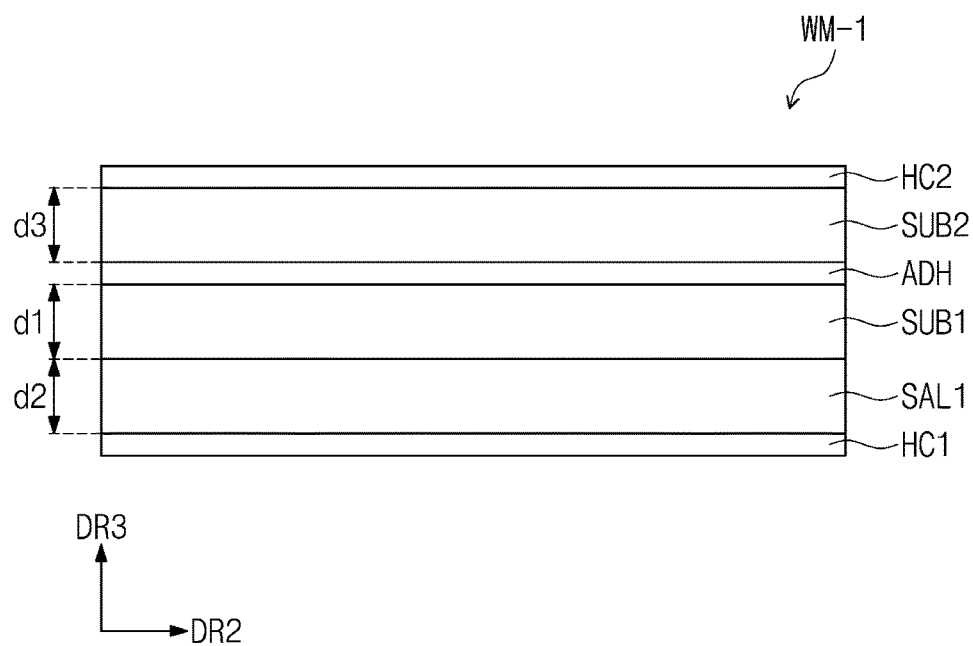

Referring to FIG. 8B, a window member WM-1 according to an embodiment of the inventive concept may include a first base member SUB1, a second base member SUB2, a first impact absorbing layer SAL1, a first hard coating layer HC1, a second hard coating layer HC2, and an adhesive layer ADH.

The second base member SUB2 may be disposed between the first base member SUB1 and the second hard coating layer HC2. The first base member SUB1 and the second base member SUB2 may be coupled to each other with the adhesive layer ADH therebetween. The adhesive layer ADH may include an optically clear adhesive film (OCA), an optically clear resin (OCR), or a pressure sensitive adhesive film (PSA). The adhesive member ADH may include an optical hardening adhesive material or a thermal hardening adhesive material.

The second base member SUB2 may include the same material as that of the first base member SUB1. For example, the second base member SUB2 may include polyimide, polyacrylate, polymethylmethacrylate (PMMA), polycarbonate (PC), polyethylenenaphthalate (PEN), polyvinylidene chloride, polyvinylidene difluoride (PVDF), polystyrene, ethylene vinylalcohol copolymer, and a combination thereof. Desirably, the second base member SUB2 may include polyimide.

The window member WM-1 according to an embodiment of the inventive concept may have the first base member and the second base member be separated from each other. Through this, although an impact is applied from the outside, the impact is distributed to the divided base members and is not transmitted to a lower portion thereof. Thus, the window member that is strong against the impact applied from the outside may be provided.

Figure 8C:
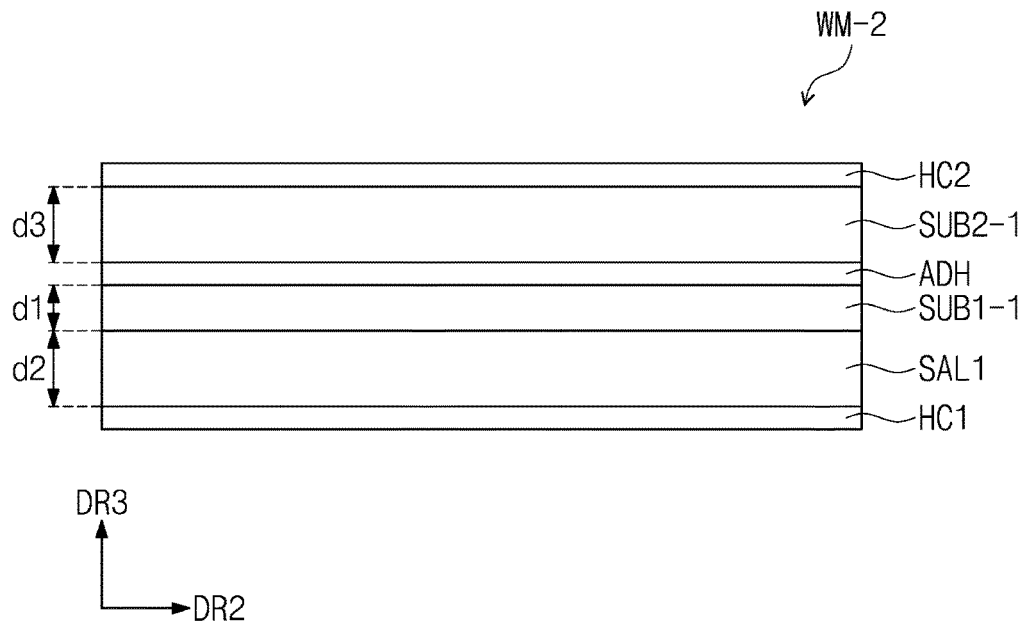

Referring to FIGS. 8B and 8C together, the window member WM-1 and WM-2 according to an embodiment of the inventive concept may respectively include the second base member SUB2 and SUB2-1 having a third thickness d3. A ratio of the third thickness d3 to the first thickness d1 may be equal to or greater than about 1.0 and equal to or less than about 1.67. For example, as illustrated in FIG. 8B, the first thickness d1 and the third thickness d3 may be the substantially same as each other. Also, as illustrated in FIG. 8C, the third thickness d3 may be greater than the first thickness d1. In detail, the third thickness d3 may be about 1.67 times the first thickness d1. The third thickness d3 may be about 50 jam, and the first thickness d1 may be about 30 μm. Here, the second thickness d2 may be the substantially same as the third thickness d3. The substantially same may mean the same thickness including the measurement error.

The window member WM-2 according to an embodiment of the inventive concept may include the second base member, which is more adjacent to an outer surface among the divided base members, and has a thickness greater than that of the first base member. Accordingly, the second base member that is relatively thick may firstly absorb the impact applied from the outside, and thus the impact transmitted to a lower portion of the divided base members may decrease. Thus, the window member that is strong against the impact applied from the outside may be provided.

Figure 8D:
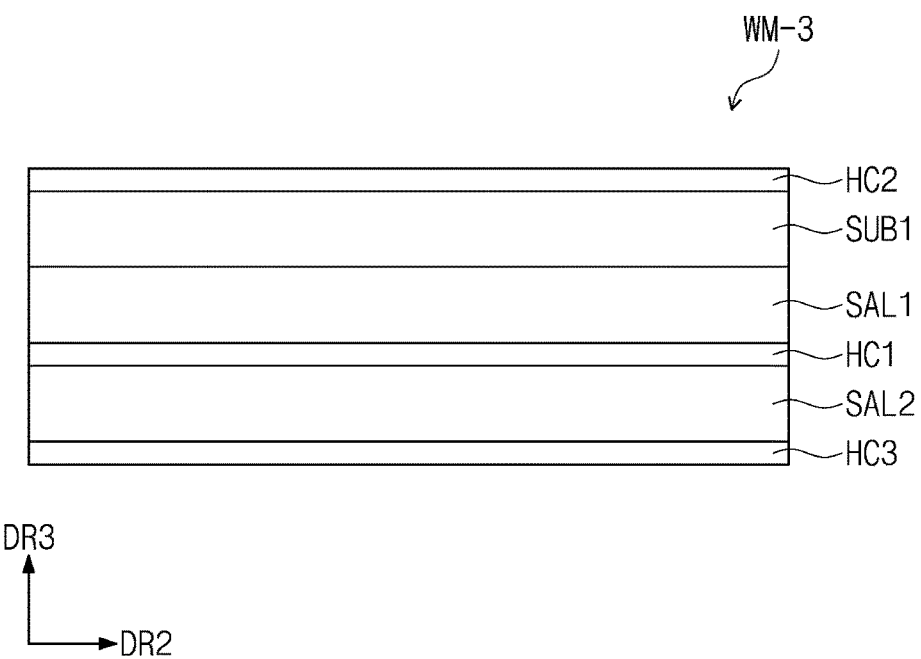

Referring to FIG. 8D, a window member WM-3 according to an embodiment of the inventive concept may further include a second impact absorbing layer SAL2 disposed on the first hard coating layer HC1 and a third hard coating layer HC3 disposed on the second impact absorbing layer SAL2.

The second impact absorbing layer SAL2 may include the same material as that of the first impact absorbing layer SAL1. The second impact absorbing layer SAL2 may include polyurethane. The second impact absorbing layer SAL2 may have a low storage modulus equal to or greater than about 45 MPa and equal to or less than about 50 MPa.

The second impact absorbing layer SAL2 may have substantially the same thickness as that of the first impact absorbing layer SAL1. For example, the second impact absorbing layer SAL2 may have a thickness equal to or greater than about 45 μm and equal to or less than about 55 μm.

The third hard coating layer HC3 may include the same material as that of each of the first hard coating layer HC1 and the second hard coating layer HC2. The third hard coating layer HC3 may include an acryl-based compound, an epoxy-based compound, or a combination thereof. The third hard coating layer HC3 may have a thickness equal to or greater than about 5 μm and equal to or less than about 10 μm and a high hardness equal to or greater than about 6H in pencil hardness.

Figure 8E:
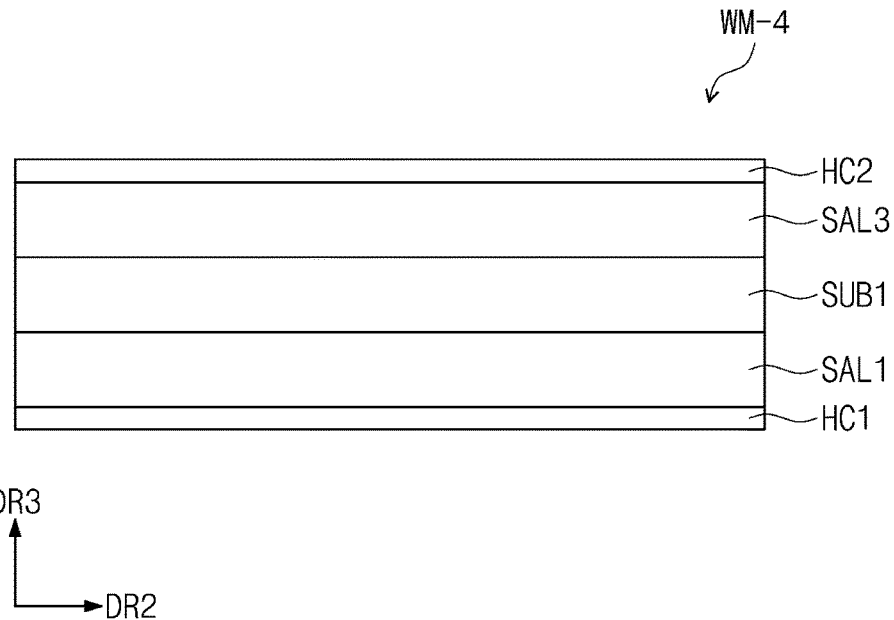

Referring to FIG. 8E, a window member WM-4 according to an embodiment of the inventive concept may further include a third impact absorbing layer SAL3 disposed between the first base member SUB1 and the second hard coating layer HC2.

The third impact absorbing layer SAL3 may include the same material as that of the first impact absorbing layer SAL1. The third impact absorbing layer SAL3 may include polyurethane. The third impact absorbing layer SAL3 may have a low storage modulus equal to or greater than about 45 MPa and equal to or less than about 50 MPa.

The third impact absorbing layer SAL3 may have substantially the same thickness as that of the first impact absorbing layer SAL1. For example, the third impact absorbing layer SAL3 may have a thickness equal to or greater than about 45 μm and equal to or less than about 55 μm.

In the window member WM-3 according to an embodiment of the inventive concept, an impact absorbing layer and a hard coating layer may be additionally laminated below the impact absorbing layer and the hard coating layer. Also, in the window member WM-4 according to an embodiment of the inventive concept, an impact absorbing layer may be additionally laminated between the base substrate and the hard coating layer that is disposed in an outward direction. Accordingly, since the additionally provided impact absorbing layer may distribute an impact applied from the outside, the window member that is strong against the impact applied from the outside may be provided.

Figure 8F:
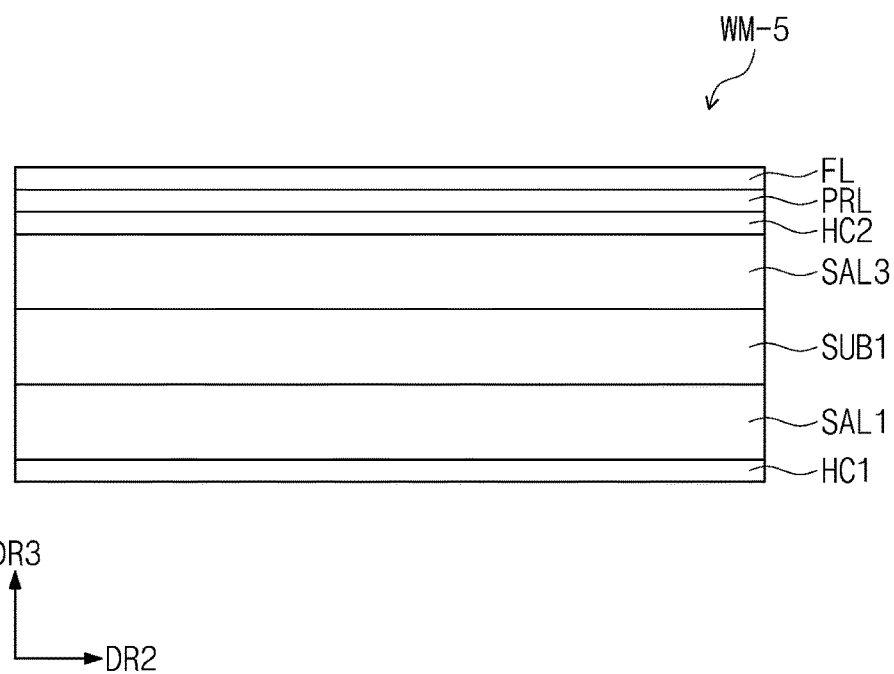

Referring to FIG. 8F, a window member WM-5 according to an embodiment of the inventive concept may further include a functional layer FL and a primer layer PRL. Although it is exemplarily illustrated in FIG. 8F that the functional layer FL and the primer layer PRL are disposed on a window member with a structure corresponding to WM-4 in FIG. 8E, an embodiment of the inventive concept is not limited thereto. For example, the functional layer FL and the primer layer PRL may be disposed on a window member with a structure corresponding to FIGS. 8A to 8D.

The functional layer FL may be disposed on the second hard coating layer HC2. The functional layer FL may include at least one of an anti-finger coating layer, an anti-reflection coating layer, an anti-fouling coating layer, and an anti-glare coating layer. The functional layer FL may be anti-fingerprint layer containing a fluorine compound. The functional layer FL may include perfluoropolyether.

The primer layer PRL may be disposed between the functional layer FL and the second hard coating layer HC2. The primer layer PRL may be an adhesive assistant layer increasing a coupling force between the functional layer FL and the second hard coating layer HC2. The primer layer PRL may include silane coupling agent and issocyanate.

Figure 9A:
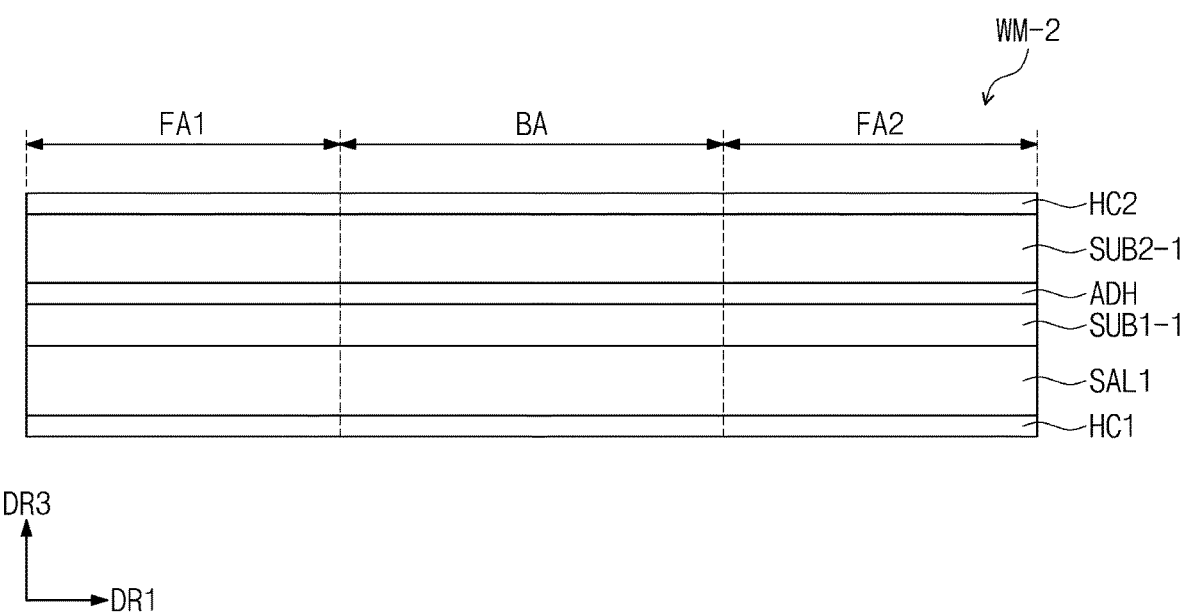
FIG. 9A is a cross-sectional view illustrating a state in which a window member according to an embodiment of the inventive concept is in a first mode.
Figure 9B:
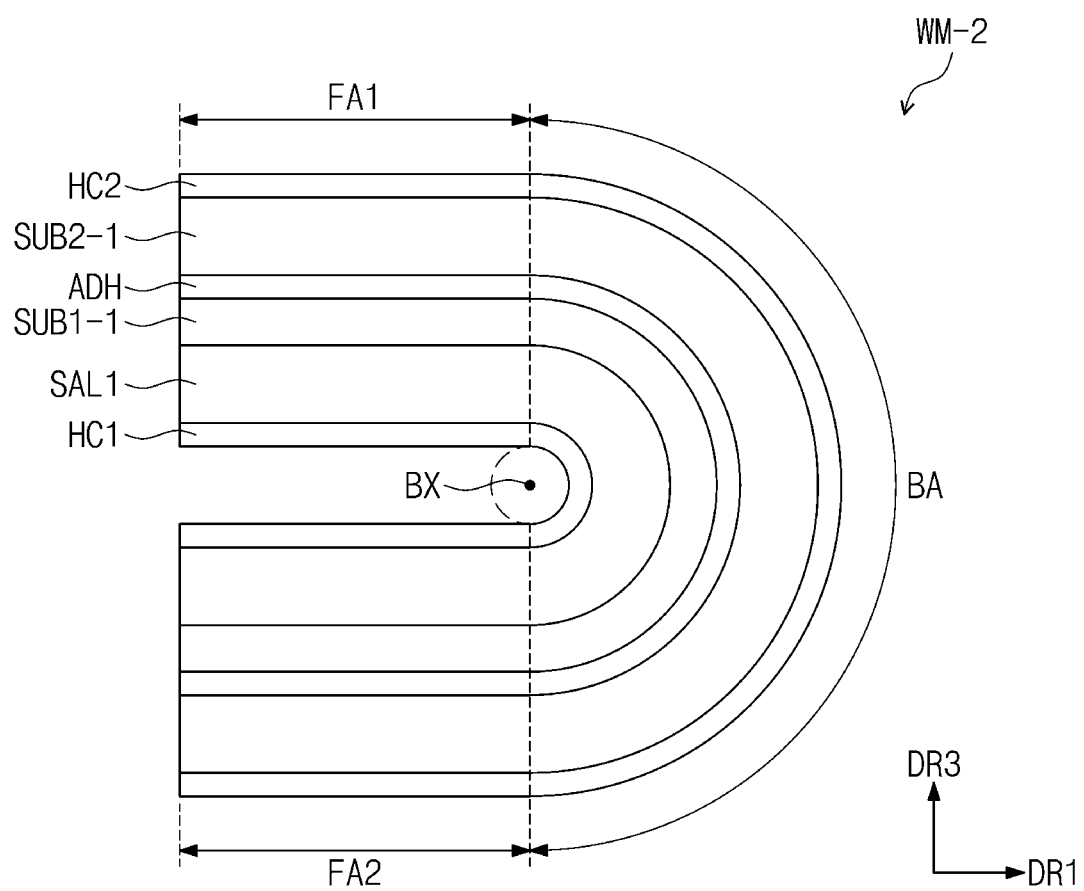
FIG. 9B is a cross-sectional view illustrating a state in which a window member according to an embodiment of the inventive concept is in a second mode.

FIG. 9A is a cross-sectional view illustrating a state in which the window member according to an embodiment of the inventive concept is in a first mode. FIG. 9B is a cross-sectional view illustrating a state in which the window member according to an embodiment of the inventive concept is in a second mode. FIGS. 9A and 9B illustrate a cross-section of the window member WM-2 according to an embodiment of the inventive concept, the cross-section which is defined by the first direction DR1 and the third direction DR3. Hereinafter, the state mode of the window member WM-2 according an embodiment of the inventive concept will be described with reference to FIGS. 9A and 9B. Meanwhile, although the state mode of the window member WM-2 in FIG. 8B according an embodiment of the inventive concept is exemplarily illustrated in FIGS. 9A and 9B, an embodiment of the inventive concept is not limited thereto. For example, the window member in FIGS. 8A, 8C to 8F may be operated in the same manner. Meanwhile, the same components as those described in FIG. 8B are designated by the same reference symbols, and overlapped description will be omitted.

Referring to FIGS. 9A and 9B, the window member WM-2 according to an embodiment of the inventive concept may be in a first mode state or a second mode state. In the first mode, as illustrated in FIG. 9A, the window member WM-2 may be in a flat state in which bending is spread out. In the second mode, as illustrated in FIG. 9B, the window member WM-2 may be in a state bent along the bending axis BX.

According to the flat first mode and the bent second mode of the window member WM-2, a flat area FA1 and FA2 and a bending area BA may be defined in the window member WM-2. The flat area may include a first flat area FA1 and a second flat area FA2, which are defined in both sides with respect to the bending area BA.

The bending area BA may correspond to a bent area in the second mode at which the window member WM-2 is folded. The bending area BA may be an area that is greatly deformed in shape relative to the flat area FA1 and FA2 in the second mode.

The first flat area FA1 and the second flat area FA2 may be areas that are less deformed in shape relative to the bending area BA in the second mode. The first flat area FA1 and the second flat area FA2 may maintain the flat state in the second mode without being deformed in shape.

The bending axis BX may be defined below the window member WM-2. As the window member WM-2 is bent with respect to the bending axis BX defined therebelow, the window member WM-2 may be out-folded. However, an embodiment of the inventive concept is not limited thereto. For example, the bending axis BX may be defined above the window member WM-2. Although the bending axis BX is disposed on a central portion of the window member WM-2 in FIGS. 9A and 9B, an embodiment of the inventive concept is not limited thereto. For example, the bending axis BX may be disposed on a position at which the window member is foldable or rollable in various manners.

As the window member according to an embodiment of the inventive concept may include the impact absorbing layer and the divided base members to have the characteristic strong to an external impact. At the same time, as each of the components included in the window member is maintained in thickness equal to or less than a limited range, when folded or rolled, a torque applied to the window member may decrease, and a compressive strain of each of the components included in the window member may decrease. Accordingly, the window member, which is strong against an external impact, for a flexible display device may be provided.

Hereinafter, an embodiment of the inventive concept will be described in more detail through a specific embodiment and a comparative example. The following embodiment is merely illustrative, and the scope of the embodiments of the inventive concept is not limited to the following embodiment.

In the below table 1, thicknesses of the components included in the window member in embodiments 1 to 3 and comparative examples 1 to 3 are shown. In the below table 1, when a component has a thickness of "0", the corresponding component is not included.

TABLE 1

| Window member | Lower hard coating layer (μm) | Lower impact absorbing layer (μm) | First base member (μm) | Second base member (μm) | Upper hard coating layer (μm) |
|---|---|---|---|---|---|
| Embodiment 1 | 10 | 50 | 50 | 0 | 10 |
| Embodiment 2 | 10/10 (2 times alternation) | 50/50 (2 times alternation) | 50 | 0 | 10 |
| Embodiment 3 | 10 | 50 | 30 | 50 | 10 |
| Comparative example 1 | 10 | 50 | 80 | 0 | 10 |
| Comparative example 2 | 10/10 (2 times alternation) | 50/50 (2 times alternation) | 80 | 0 | 10 |
| Comparative example 3 | 10 | 0 | 30 | 50 | 10 |

In the embodiment 1, the window member is manufactured such that the lower hard coating layer of about 10 μm, the lower impact absorbing layer of about 50 m, the first base member of about 50 m, and the upper hard coating layer of about 10 μm are sequentially laminated.

In the embodiment 2, the window member is manufactured such that the lower hard coating layer of about 10 μm and the lower impact absorbing layer of about 50 μm and the lower hard coating layer of about 10 μm and the lower impact absorbing layer of about 50 μm are sequentially laminated to form a lower structure, and, the first base member of about 50 μm, and the upper hard coating layer of about 10 μm are sequentially laminated on the lower structure.

In the embodiment 3, the window member is manufactured such that the lower hard coating layer of about 10 μm, the lower impact absorbing layer of about 50 μm, the first base member of about 30 μm, the second base member of about 30 μm, and the upper hard coating layer of about 10 μm are sequentially laminated. In the embodiment 3, the first window member and the second window member are bonded to each other through a pressure sensitive adhesive film (PSA) having a thickness of about 25 μm.

In the comparative example 1, the window member is manufactured to have the same lamination structure as that in the embodiment 1, except that the first base member has a thickness of about 80 μm, which is thicker than that of the impact absorbing layer, in the lamination structure of the embodiment 1. In the comparative example 2, the window member is manufactured to have the same lamination structure as that in the embodiment 2, except that the first base member has a thickness of about 80 μm, which is thicker than that of the impact absorbing layer, in the lamination structure of the embodiment 2. In the comparative example 3, the window member is manufactured to have the same lamination structure as that in the embodiment 3, except that the lower impact absorbing layer is omitted from the lamination structure of the embodiment 3.

In the below table 2, reliability test results obtained by performing the torque value test, the pen drop test, the DuPont strength characteristic evaluation, and the scuff characteristic evaluation according to bending of the window member in embodiments 1 to 3 and comparative examples 1 to 3 are comparatively shown. The pen drop test and the DuPont strength evaluation evaluate a height at which a crack is initiated by evaluating a time for crack initiation in the window member when a pen or a weight is dropped from a predetermined height. The scuff characteristic is performed such that a weight of about 1.5 kg moves back and forth about 10 times with respect to a surface of the window member by using a scuff evaluation device, and then it is checked by naked eyes whether scratches are generated.

TABLE 2

| Window member | Torque (N · cm) | Pen drop test (cm) | DuPont test (cm) | Scuff test (1.5 kg, 10 times) |
|---|---|---|---|---|
| Embodiment 1 | 12~13 | 12 | 5 | OK |
| Embodiment 2 | 14~15 | 15 | 7 | OK |
| Embodiment 3 | 14~15 | 19 | 7 | OK |
| Comparative example 1 | 14~15 | 12 | 5 | OK |
| Comparative example 2 | 16~17 | 15 | 7 | OK |
| Comparative example 3 | 13 | 12 | 7 | OK |

Referring to the table 2, when compared with the comparative examples, the embodiments show strong characteristics against an external impact with respect to the torque value applied to the window member.

When the embodiment 1 and the comparative example 1, which have the similar lamination structure, are compared, since similar evaluation values are obtained on the basis of results of the pen drop test and the DuPont impact test, it may be checked that the embodiment 1 and the comparative example 1 have a similar degree of impact resistance. Here, the torque value applied to the window member decreases in the embodiment 1, because the first base substrate of the embodiment 1 has a thickness less than that of the comparative example 1 and, more particularly, has the same thickness as that of the lower impact absorbing layer. Through this, the window member of the embodiment 1 may be applied to a flexible display device while maintaining the impact resistance similar to that of the comparative example 1.

In case of the embodiment 2 and the comparative example 2, in which the lower impact absorbing layer and the lower hard coating layer are alternately laminated two times, it may be checked that the embodiment 2 and the comparative example 2 have the higher impact resistance than that of the embodiment 1 and the comparative example 1. Here, when compared with the comparative example 2, the torque value applied to the window member in the embodiment 2 decreases, because the first base substrate and the lower impact absorbing layer have the same thickness as each other. Through this, the window member of the embodiment 2 may be applied to a flexible display device while maintaining the impact resistance similar to that of the comparative example 2.

When compared with the lamination structure of the comparative example 1, the embodiment 3 may have a structure in which the base member is divided into two base members having a relatively thin thickness. Through this, the window member of the embodiment 3 may have the remarkably improved impact resistance with respect to an external impact while having a similar degree of the torque value when compared with that of the comparative example 1. Also, as the lower impact absorbing layer is disposed below the divided base member in the embodiment 3, the impact resistance with respect to an external impact may be remarkably improved in comparison with the comparative example 3 in which the lower impact absorbing layer is not provided. Through this, the window member of the embodiment 3 may be applied to a flexible display device to protect the display module against an external impact.

The window member according to the embodiment of the inventive concept may have the improved impact resistance with respect to an external impact while maintaining the flexibility.

The display device according to the embodiment of the inventive concept may have the characteristic strong against an external impact and simultaneously secure the flexibility when folded or rolled.

Although the exemplary embodiments of the present inventive concept have been described, it is understood that the present inventive concept should not be limited to these exemplary embodiments but various changes and modifications can be made by one ordinary skilled in the art within the spirit and scope of the present inventive concept as hereinafter claimed. Hence, the real protective scope of the inventive concept shall be determined by the technical scope of the accompanying claims.

What is claimed is:

1. A window member comprising:
   a first base member having a first thickness and a first storage modulus, and a first surface and a second surface that is opposite to the first surface;
   an impact absorbing layer disposed on the first surface of the first base member and having a second thickness and a second storage modulus that is less than the first storage modulus of the first base member;
   a first hard coating layer disposed on the impact absorbing layer; and
   a second hard coating layer disposed on the second surface of the first base member,
   wherein a ratio of the second thickness to the first thickness is equal to or greater than 1.0 and equal to or less than 1.67,
   wherein the first surface of the first base member contacts the impact absorbing layer, and the second surface of the first base member contacts a layer that is different from the impact absorbing layer, and
   wherein the first hard coating layer contacts a surface of the impact absorbing layer.

2. The window member of claim 1, wherein the first thickness is equal to or greater than 30 µm and equal to or less than 55 µm, and
   the second thickness is equal to or greater than 45 µm and equal to or less than 55 µm.

3. The window member of claim 1, further comprising:
   a second impact absorbing layer disposed on the first hard coating layer and having a substantially same thickness as the second thickness; and
   a third hard coating layer disposed on the second impact absorbing layer.

4. The window member of claim 1, further comprising:
   a second base member disposed between the first base member and the second hard coating layer and having a third thickness; and
   an adhesive member disposed between the first base member and the second base member to couple the first base member to the second base member.

5. The window member of claim 4, wherein a ratio of the third thickness to the first thickness is equal to or greater than 1.0 and equal to or less than 1.67.

6. The window member of claim 4, wherein the third thickness is equal to or greater than 45 μm and equal to or less than 55 μm.

7. The window member of claim 4, wherein the second base member has a third surface facing the first base member and a fourth surface opposite to the third surface, and
the second hard coating layer contacts the fourth surface of the second base member.

8. The window member of claim 1, further comprising a third impact absorbing layer disposed between the first base member and the second hard coating layer and having a storage modulus less than that of the first base member and a substantially same thickness as the second thickness.

9. The window member of claim 1, further comprising:
a functional layer disposed on the second hard coating layer; and
a primer layer disposed between the functional layer and the second hard coating layer to increase an adhesion force between the functional layer and the second hard coating layer.

10. The window member of claim 1, wherein the first base member comprises:
a bending area that is bendable along a bending axis extending in a first direction; and
a flat area defined as an area adjacent to the bending area.

11. The window member of claim 1, wherein the first base member comprises polyimide.

12. The window member of claim 1, wherein the impact absorbing layer comprises polyurethane, silicon-based polymer, or rubber.

13. The window member of claim 1, wherein the first storage modulus of the first base member is equal to or greater than 3.5 GPa and equal to or less than 7.0 GPa, and
the second storage modulus of the impact absorbing layer is equal to or greater than 45 MPa and equal to or less than 50 MPa.

14. The window member of claim 1, wherein the first hard coating layer has a thickness equal to or greater than 5 μm and equal to or less than 10 μm.

15. A window member comprising:
a first base member having a first storage modulus, and a first surface and a second surface opposite to the first surface, the first base member being bendable with respect to a bending axis extending in a first direction;
an impact absorbing layer disposed on the first surface of the first base member to contact the first surface of the first base member and having a second storage modulus that is less than the first storage modulus of the first base member;
a first hard coating layer disposed on the impact absorbing layer to contact a surface of the impact absorbing layer;
a second hard coating layer disposed on the second surface of the first base member; and
a second base member disposed between the first base member and the second hard coating layer,
wherein the first surface of the first base member contacts the impact absorbing layer, and the second surface of the first base member contacts a layer that is different from the impact absorbing layer.

16. A display device comprising:
a display module having a top surface configured to display an image and a rear surface that is opposite to the top surface; and
a window member disposed on the top surface of the display module,
wherein the window member comprises:
a first hard coating layer disposed on the top surface;
an impact absorbing layer disposed on the first hard coating layer;
a first base member having a first surface and a second surface, and disposed on the impact absorbing layer; and
a second hard coating layer disposed on the first base member,
wherein a ratio of a thickness of the impact absorbing layer to a thickness of the first base member is equal to or greater than 1.0 and equal to or less than 1.67,
wherein the first surface of the first base member contacts the impact absorbing layer, and the second surface of the first base member contacts a layer that is different from the impact absorbing layer, and
wherein the first hard coating layer contacts a surface of the impact absorbing layer.

17. The display device of claim 16, wherein the window member further comprises:
a third hard coating layer disposed between the display module and the first hard coating layer; and
a second impact absorbing layer disposed between the third hard coating layer and the first hard coating layer, and
wherein the second impact absorbing layer has a substantially same thickness as that of the impact absorbing layer.

18. The display device of claim 16, wherein the impact absorbing layer has a thickness equal to or greater than 45 μm and equal to or less than 55 μm, and
the first base member has a thickness equal to or greater than 30 μm and equal to or less than 55 μm.

19. The display device of claim 16, further comprising:
a second base member disposed between the first base member and the second hard coating layer; and
an adhesive member disposed between the first base member and the second base member to couple the first base member to the second base member,
wherein a ratio of a thickness of the second base member to a thickness of the first base member is equal to or greater than 1.0 and equal to or less than 1.67.

20. The display device of claim 16, wherein the first hard coating layer contacts one of the top surface and the rear surface of the display module,
the impact absorbing layer contacts a third surface of the hard coating layer, and
the first base member contacts a fourth surface of the impact absorbing layer.

21. The display device of claim 16, wherein the window member comprises:
a bending area that is bendable along a bending axis extending in a first direction.

* * * * *